United States Patent [19]
Son

[11] Patent Number: 5,781,134
[45] Date of Patent: Jul. 14, 1998

[54] SYSTEM FOR VARIABLE LENGTH CODE DATA STREAM POSITION ARRANGEMENT

[75] Inventor: Jae Cheol Son, Cupertino, Calif.

[73] Assignee: Samsung Electronics Company, Ltd., Seoul, Rep. of Korea

[21] Appl. No.: 731,338

[22] Filed: Oct. 18, 1996

[51] Int. Cl.$^6$ .................................................. H03M 7/00
[52] U.S. Cl. .................................................. 341/67; 341/65
[58] Field of Search ........................... 641/65, 67, 50, 641/63

[56] References Cited

U.S. PATENT DOCUMENTS

| | | | |
|---|---|---|---|
| 5,079,548 | 1/1992 | Fujiyama et al. | 341/67 |
| 5,321,398 | 6/1994 | Ikeda | 341/67 |

*Primary Examiner*—Jeffrey A. Gaffin
*Assistant Examiner*—Peguy Jean Pierre
*Attorney, Agent, or Firm*—Skjerven, Morrill, MacPherson, Franklin & Friel, L.L.P.; Kent B. Chambers

[57] ABSTRACT

An entropy code look up table processes incoming data and provides an n-bit output signal having an entropy code word and a bit_length output signal. Entropy code words are successively packed without spacing bits into two sixteen-bit latches. An arithmetic unit keeps track of accumulated sizes of packed, unconveyed entropy code words. The n-bit output signal is converted into a thirty-two bit signal with spacing bits on either side of a current entropy code word. Using the accumulated size information, flow through multiplexer units insert spacing bits in bit positions corresponding to bit positions currently occupied by packed entropy code words. Any remaining bits in the thirty-two bit output signal are preferably set to logical zeros. With the current entropy code word properly aligned in the thirty-two bit output signal, a path selection logic unit utilizes the accumulated size information and a unary decoder to form a sixteen bit output signal. Previously packed entropy code word(s) occupy the most significant bit(s). The remaining bit(s) are set to logical values of the current entropy code word most significant bits. These sixteen bits are written into a selected latch, and the thirty-two bit output signal least significant sixteen bits are written into the other latch. The arithmetic unit determines the number unconveyed, packed entropy code word bits. If the number is greater than fifteen, at least one of the latches is full. This number is used by the path selection logic unit to properly select the most significant latch.

32 Claims, 4 Drawing Sheets

SYSTEM FOR VARIABLE LENGTH CODE DATA STREAM POSITION ARRANGEMENT

BACKGROUND OF THE INVENTION

1. Field of the Invention

This invention relates to signal processing, particularly to bitstream encoding operations, and more particularly to efficiently arranging variable length code to data stream positions in a closely packed format.

2. Description of the Related Art

Data transmission involving voluminous quantities of information has become a frequent occurrence with the advent of large bandwidth transmission capabilities and implementation of high speed processing applications and equipment. One of the driving forces behind large scale data transmission is the increasing use of multimedia operations. Although the computing power of processors has advanced steadily and rapidly, the demand for higher processing power and computing efficiency remains unabated due to the development of aggressive new applications in the multimedia field that call for the display and performance of ever larger data quantities. To reconcile the information quantities involved with transmitting, receiving, and processing limitations, various compression standards have attained wide spread use for compressing and decompressing information. Widely accepted and used compression and decompression standards for video data are the International Organization for Standardization/International Electrotechnical Commission (ISO/IEC) Motion Pictures Experts Group (MPEG) MPEG-1 and MPEG-2 standards, and the United Nation's International Telecommunications Union Telecommunications Standardization Bureau (ITU-T) H.261 and H.263 standards.

The MPEG-1, MPEG-2, H.261, and H.263 standards extensively utilize variable length code ("VLC") words to assist in achieving reasonable compression ratios. The VLC words are generally characterized in tables commonly referred to as Huffman tables or entropy code tables.

SUMMARY OF THE INVENTION

In one embodiment of the present invention an apparatus to arrange variable length code words in a storage device, each variable code word having a predetermined bit length, includes a variable length code position arrangement module. The variable length code position arrangement module includes an arithmetic module having an adder and an accumulator register, wherein the arithmetic module receives predetermined variable length code bit length signals for each variable length code word, and the accumulator accumulates variable length code bit length information, and the adder sums accumulated variable length code bit length information and a current variable bit code length. A multi-stage data processing module includes an input node to receive an n-bit signal and an input node to receive accumulated variable length code bit length information, wherein the n-bit signal includes a variable length code word. The multi-stage processing module arranges the n-bit signal within an m-bit signal, an arranged m-bit signal having a number of spacing bits equal to the accumulated variable length code bit length information preceding the n-bit signal.

In another embodiment of the present invention a method of arranging a variable length code word in a storage device of a data processing system, each variable length code word having a predetermined bit length, includes the steps of receiving a bit_length signals representing the bit length of the variable length code words and accumulating bit length information of previously stored variable length code words from the received bit_length signals. The method further includes the steps of receiving an n-bit input signal representing a variable length code word, arranging the variable length code word within an m-bit signal, the m-bit signal having x spacing bits preceding the variable length code word, wherein x corresponds to the accumulated bit length information, and combining the least significant m−x bits of the m-bit signal with the x most significant contents of the storage device.

BRIEF DESCRIPTION OF THE DRAWINGS

The same feature appearing in multiple figures has the same reference numeral.

DETAILED DESCRIPTION OF THE PREFERRED EMBODIMENTS

The following description of the invention is intended to be illustrative only and not limiting.

The aggressive demands of multimedia computing carry forward to various aspects of data processing and call for increased data processing efficiency including efficient and rapid allocation of bit stream bit positions and insertion of entropy code words into data bit streams. This "packing" of entropy code words advantageously further decreases the bandwidth necessary to transmit a given amount of useful data over bandwidth increases attributed to the actual use of entropy code.

Entropy code words by their very nature vary in length and generally cannot be efficiently allocated to and inserted into predetermined bit stream bit positions. Implementing a highly efficient and elegant approach to data packing operations involving variable length data words allows for high speed data packing. Efficient and accurate packing of entropy code words is also complicated by the use of latches to store data prior to data transmission. Employing latches allows a multimedia signal processor 200 to efficiently allocate processing resources while entropy code word packing operations continue. The latch bit storage capacity typically exceeds most entropy code word bit lengths, therefore attention must be given to successively writing new entropy code words in a latch without disturbing previously stored and unused data. Furthermore, employing multiple latches allows each latch to generally be filled more quickly than a single combined latch. Additionally, an additional latch handles overflow from a currently used latch generally allowing a packing operation to continue unabated. However, using multiple latches calls for efficient and accurate coordination to accurately pack entropy code words. Moreover, when implemented on a microchip using integrated circuit technology, efficient use of microchip real estate may decrease the cost of the microchip and/or allow for additional functionality. As a result, multiple use of available resources such as generated signals may increase efficient microchip resource utilization.

The immediately following material provides a general overview of multimedia multiprocessor system 100 which in one embodiment includes multimedia signal processor 200 which is any of the Samsung Semiconductor, Inc.'s MSP family of multimedia signal processors. For additional detail, please refer to co-pending U.S. patent application Ser. No. 08/697,102 of L. Nguyen, entitled "Microprocessor Operation in a Multimedia Signal Processor", Ser. No. 08/699,597 of L. Nguyen, entitled "Single-Instruction-Multiple-Data Processing in a Multimedia Signal Processor", Ser. No. 08/697,086 of L. Nguyen et al., entitled "Single-Instruction-Multiple-Data Processing Using Multiple Banks of Vector Registers", and Ser. No. 08/699,585 of M. Mohamed et al., entitled "Single-Instruction-Multiple-Data Processing With Combined Scalar-Nector Operations" all of which are incorporated herein by reference in their entirety.

Figure 1:
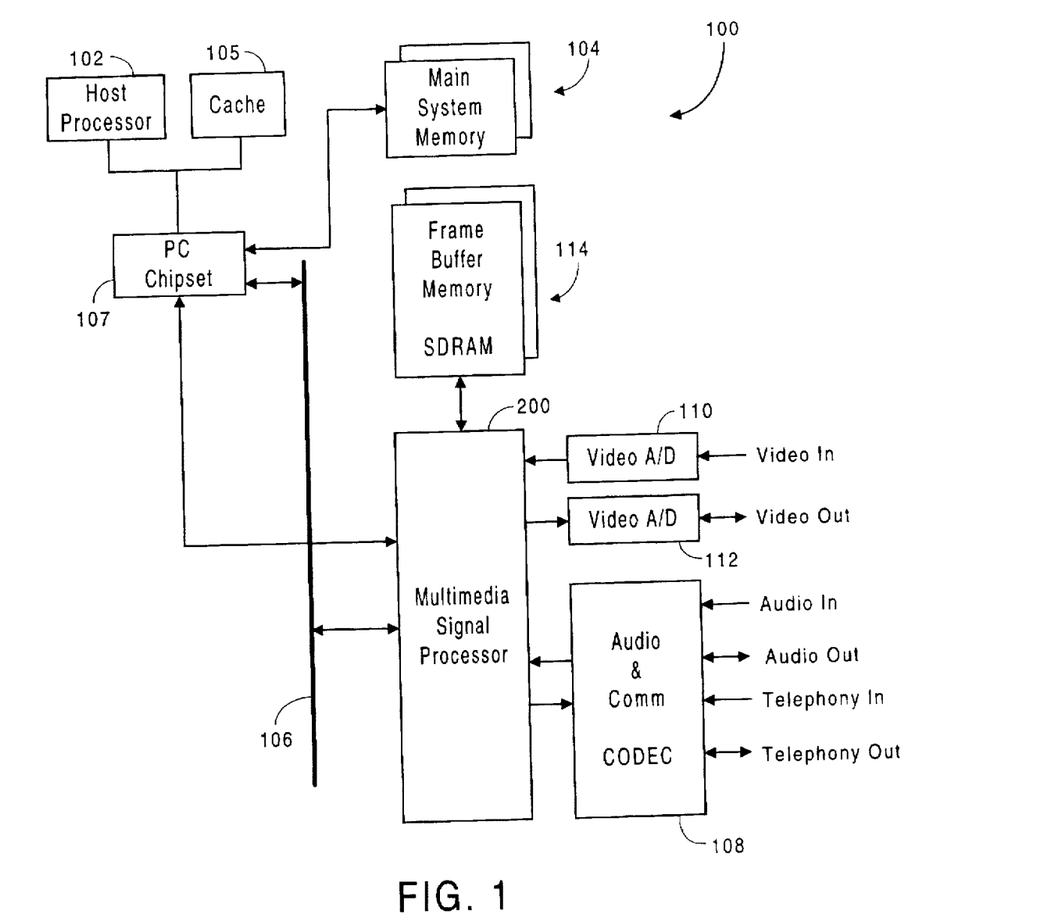
FIG. 1 is a high-level schematic block diagram illustrating a multimedia multiprocessor system in accordance with an embodiment of the present invention.

Referring to FIG. 1, a high-level schematic block diagram illustrates a multimedia multiprocessor system 100 including a host processor 102 and a multimedia signal processor 200. A typical host processor 102 is an x86 processor such as an Intel Corporation Pentium™ or Pentium Pro™ processor. The host processor 102 executes programs based on instructions and data held primarily in a system memory 104 and cache 105. The host processor 102 communicates with the multimedia signal processor 200 via a PC chipset 107 and a system bus 106, such as a PCI bus. The multimedia signal processor 200 interfaces to various functional blocks such as an audio and communication CODEC 108 for receiving audio and telephony communication, a video A/D converter 110 for receiving video input signals, a video DIA converter 112 for transmitting video output signals, and a frame buffer SDRAM memory 114. In one embodiment the multimedia signal processor is any of the Samsung Semiconductor, Inc.'s MSP family of multimedia signal processors (Samsung MSP).

Figure 2:
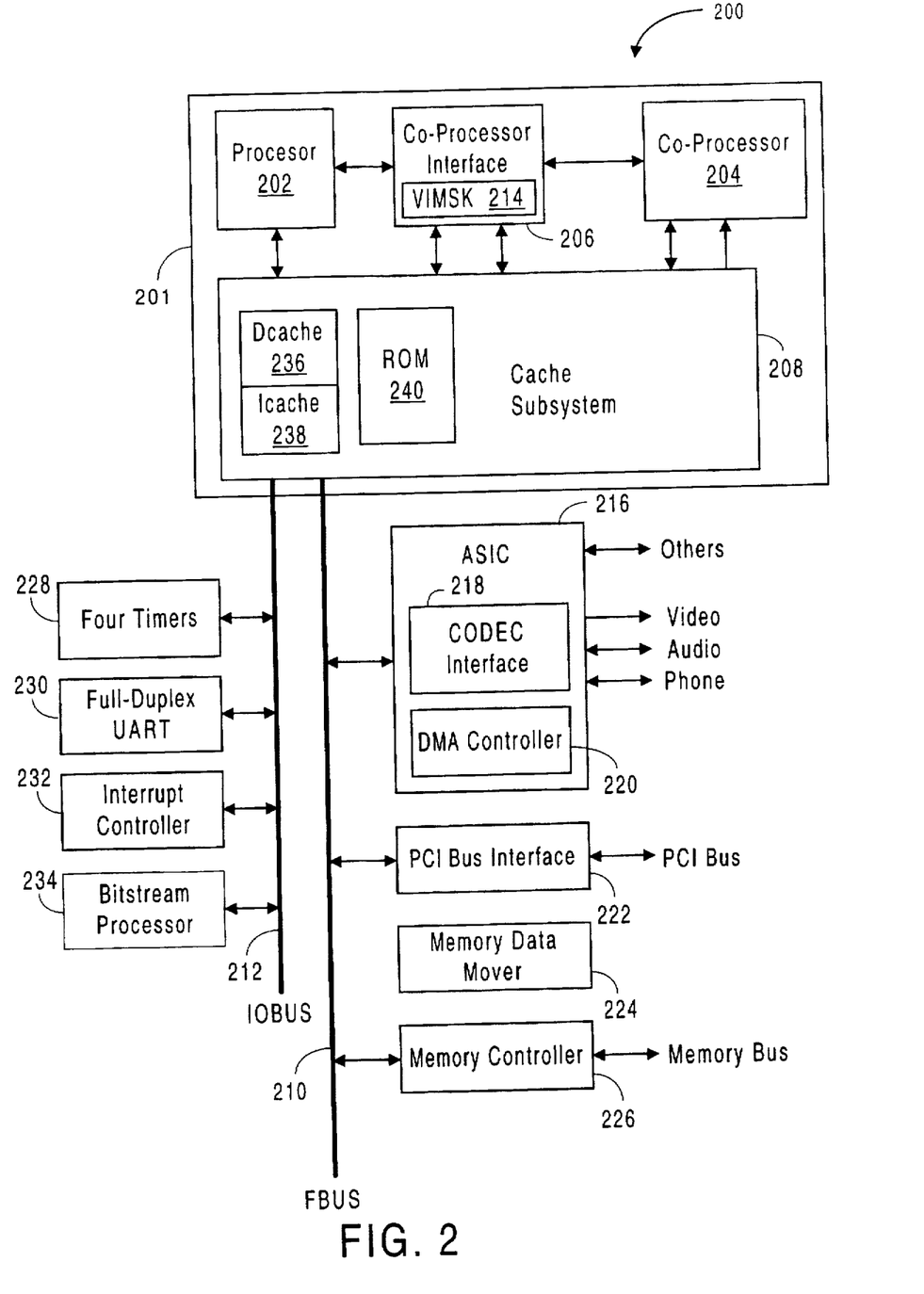
FIG. 2 is a schematic block diagram showing a multimedia signal processor of the multimedia multiprocessor system illustrated in FIG. 1.

Referring to FIG. 2, a schematic block diagram shows the multimedia signal processor 200 of the multimedia multiprocessor system 100 (FIG. 1). The multimedia signal processor 200 includes a digital signal processor ("DSP") core 201 which interfaces via a fast bus (FBUS) 210 to a plurality of FBUS peripherals including, for example, a 32-bit PCI bus interface 222, a 64-bit SDRAM memory controller 226, an 8-channel DMA controller 220, an ASIC logic block 216, and a memory data mover 224 for moving data between the host processor 102 and frame buffer SDRAM memory 114. The PCI bus interface 222 interfaces to the system bus 106 and operates, for example, at 33 MHz. The ASIC logic block 216 furnishes control logic for implementing custom functionality, as desired. The ASIC logic block 216, in one embodiment, supplies 10 Kgates including interfaces to various analog compression/decompression (codec) and customer-specific I/O devices. The memory data mover 224 transfers DMA data from the host processor 102 to SDRAM memory 114 which is local to the multimedia signal processor 200. The DSP core 201 also interfaces via an I/O bus to a plurality of I/O bus devices including, for example, an 8254-compatible programmable interval timer 228, a 16450-compatible UART serial line 230, an 8259-compatible programmable interrupt controller 232, and a bitstream processor 234 for processing a video bit stream.

The DSP core 201 is the computation engine of the multimedia signal processor 200 and includes a processor 202, a co-processor 204, a cache subsystem 208, the fast bus (FBUS) 210, and the I/O bus 212. In one embodiment, the processor 202 is a 32-bit ARM7™ RISC control processor which performs general processing functions such as context switch enable requests, real-time operating system operations, interrupt and exception handling, input/output device management, communication with the host processor 102 and the like. In one embodiment, the processor 202 operates at 40 MHz. The processor 202 interfaces to the co-processor 204 through a co-processor interface 206.

The processor 202 performs the exception handling in response to exceptions, generally conditions that occur during instruction processing, causing a modification of execution control flow. For more information regarding exception handling, please refer to co-pending U.S. patent application Ser. No. 08/699,295 of Song et al., entitled "System And Method For Handling Software Interrupts With Argument Passing" and Ser. No. 08/699,294 of Song et al., entitled "System And Method For Handling Interrupt And Exception Events In An Asymmetric Multiprocessor Architecture" which are incorporated herein by reference in their entirety.

The co-processor 204 is the digital signal processing engine of the multimedia signal processor 200. In one embodiment, co-processor 204 is a vector processor of the Samsung MSP family. As a vector processor, the co-processor 204 has a Single-Instruction Multiple-Data architecture and includes a pipelined RISC engine that operates on multiple data elements in parallel to perform signal processing functions such as Discrete Cosine Transforms (DCT), FIR filtering, convolution, video motion estimation and other processing operations. The co-processor 204 supports vector arithmetic in which multiple data elements are operated upon in parallel, in the manner of a vector process, by a plurality of vector arithmetic units. The co-processor 204 executes both scalar operations and combined vector-scalar operations. The multiple data elements of the co-processor 204 are packed in a 576-bit vector which is computed at a rate of thirty-two 8/9-bit fixed-point arithmetic operations, sixteen 16-bit fixed-point arithmetic operations, or eight 32-bit fixed-point or floating point arithmetic operations per cycle (for example, 12.5 ns). Most 32-bit scalar operations are pipelined at a rate of one instruction per cycle while most 576-bit vector operations are pipelined at a rate of one instruction in two cycles. Load and store operations are overlapped with arithmetic operations and are executed independently by separate load and store circuits.

Figure 3:
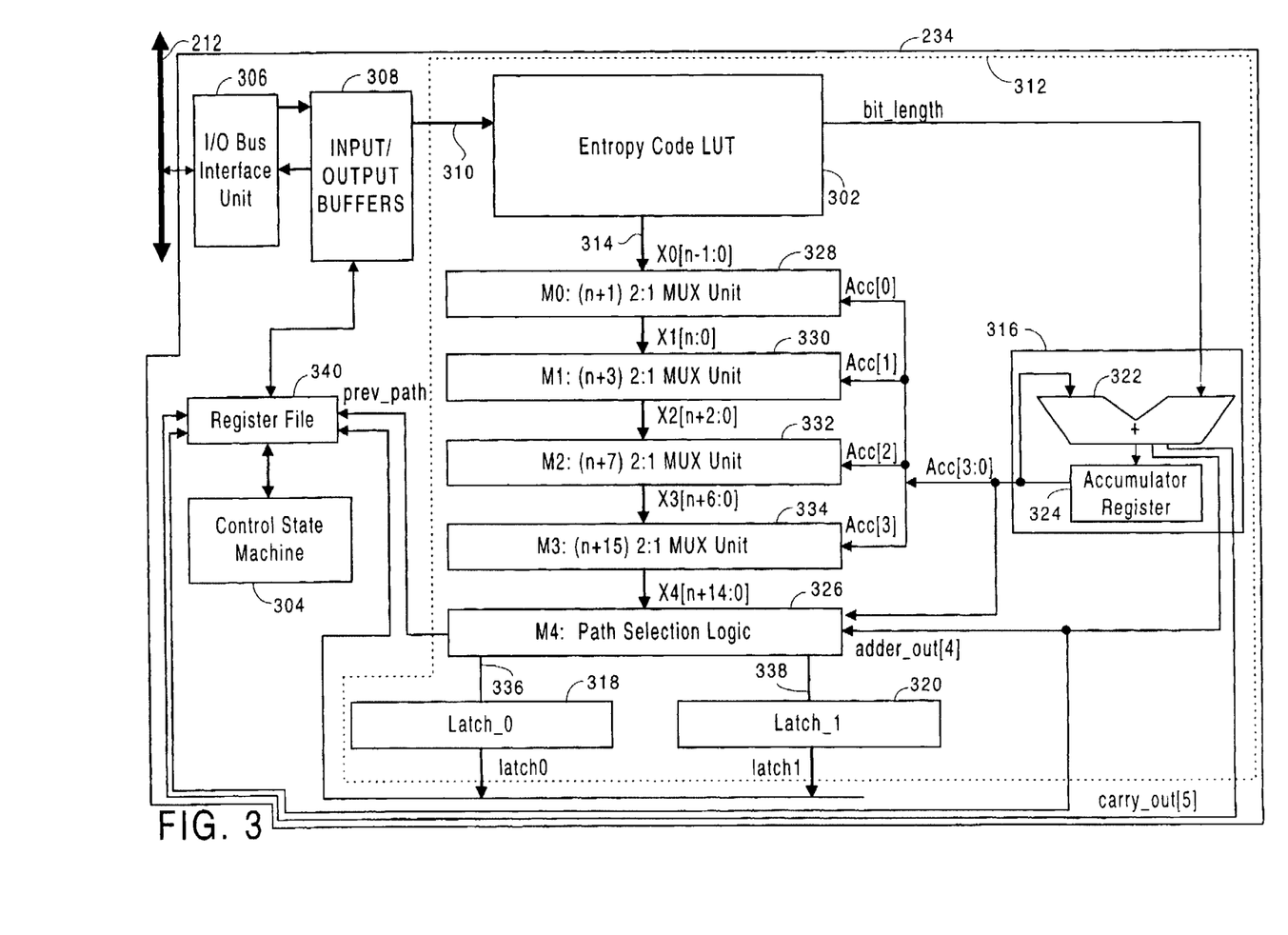
FIG. 3 is an embodiment of a bitstream processor of the multimedia signal processor of FIG. 2 and includes a variable length code data stream position arrangement module.

Referring to FIG. 3, the bitstream processor 234 is one of the multimedia multiprocessor system 100 internal peripherals. The bitstream processor 234 is a specialized hardware logic block that supports various bit stream video data compression and decompression. The bitstream processor 234 is especially designed for bit-level processing and works as an independent processing unit under software control by either processor 202 or co-processor 204. More specifically, the bitstream processor 234 encodes and decodes all information contained in a slice or group of blocks ("GOB") layer and below and receives information from and transmits information to the DSP core 201 through the I/O bus 212. An encoded bit stream generally includes start codes, header parameters, and compressed data according to the applied compression standard.

In a multimedia environment, video sequences are processed and displayed on, for example, personal computers and video conferencing equipment. The video sequences are generally in the form of a compressed bit stream encoded using any of a plurality of video standards such as the International Organization for Standardization/International Electrotechnical Commission (ISO/IEC) Motion Pictures Experts Group (MPEG) MPEG-1 and MPEG-2 standards, and the United Nation's International Telecommunications Union Telecommunications Standardization Bureau (ITU-T) H.261 and H.263 standards. MPEG-1, MPEG-2, H.261, and H.263 are respectively described in the International Standard of the International Organization for Standardization and the International Electrotechnical Commission (ISO/IEC) 11172-2 (1992) (MPEG-1), the ISO/IEC Joint Technical Committee (JTC) 1/SC 29 N 0981 Rev (Mar. 31, 1995) (MPEG-2), the United Nation's International Telecommunications Union—Telecommunications Standardization Bureau (ITU-T) H.261 recommendation, and the ITU-T H.263 recommendation, all of which are incorporated by reference in their entirety. It will be understood that the multimedia multiprocessor system 100 may be adapted to process bit streams formatted in accordance with other standards.

Referring to FIG. 3, the bitstream processor 234 is one of the multimedia multiprocessor system 100 internal peripherals. The bitstream processor 234 is a specialized hardware logic block that supports various bit stream video data compression and decompression, the bitstream processor 234 is especially designed for bit-level processing. The bitstream processor 234 works as an independent processing unit and is under software control by either processor 202 or co-processor 204. More specifically, the bitstream processor 234 encodes and decodes all information contained in a slice or group of blocks ("GOB") layer and below and receives information from and transmits information to the DSP core 201 through the I/O bus 212. The bitstream processor 234 performs output data packing for data encoding operations. A 768×12-bit VLC look-up table read only memory LUT 302 stores all necessary information for all entropy code processing. Control state machine 304 controls all encoding and decoding activities. For more information regarding bitstream processor 234, please refer to co-pending U.S. patent application Ser. No. 08/699,303 of C. Reader, entitled "Methods and Apparatus for Processing Video Data", which is incorporated herein by reference in its entirety. In particular, please refer to the Description of the Preferred Embodiments and Appendices A, chapter ten and B of the U.S. patent application Ser. No. 08/699,303 of C. Reader. Chapter B particularly sets forth the topology and methodology of LUT 302.

When bitstream processor 234 is enabled by DSP core 201, data for encoding is input to bitstream processor 234 via I/O bus 212, I/O bus interface unit 306, and I/O buffers 308 into LUT 302 via data path 310. Information may be bidirectionally transferred between I/O bus 212, I/O bus interface unit 306, and I/O buffers 308.

Referring to FIG. 3, one embodiment of a system for VLC data stream position arrangement is the VLC data stream position arrangement module 312 which implements an efficient packing operation. After data is processed by LUT 302, conduction path 314 conducts an n-bit entropy code output signal, X0|n−1:0|. The n-bit output signal preferably has a bit length equal to the maximum bit length-of an entropy code word supported by multimedia signal processor 200. When supporting MPEG-1, MPEG-2, H.261, and H.263, n equals seventeen. The most significant bits ("MSBs") of the entropy code output signal X0|n−1:0| include a current entropy code word and any remaining bits are filled with spacing bits which in this embodiment are zeros.

LUT 302 includes a second output signal, bit_length, which represents the bit length of the current entropy code word. An arithmetic unit 316 utilizes signal bit_length to register, i.e. keep track of, a number of unconveyed latch bit positions existing prior to a current entropy code word storing operation to efficiently pack entropy code words. Arithmetic unit 316 also uses signal bit_length to determine a number of unconveyed bit positions existing subsequent to a current entropy code write operation to appropriately select one of a plurality of latches for a write operation and to notify control state machine 304 of availability for access to packed entropy code words.

Arithmetic unit 316 includes a 6-bit adder unit 322 that adds the 4-bit contents of accumulator register 324, Acc |3:0|, with signal bit_length and stores the four least significant bits ("LSBs") in accumulator register 324. Accordingly, the current contents of accumulator register 324 represent size information, up to fifteen bits, based on accumulated entropy code word bit lengths. Latch_0 318 and latch_1 320 each store 16 bits, signal Acc|3:0|, in conjunction with the operation of multiplexer units 328, 330, 332, and 334 and path selection logic 326, signal Acc|3:0| represents the number of unconveyed bit positions in a currently selected one of latch_0 318 or latch_1 320.

The fifth bit of adder unit 322 is output as signal adder_out|4| which notifies path selection logic 326 and control state machine 304 that more than fifteen unconveyed packed entropy code word bits have been generated. The sixth bit of adder unit 322 is output as signal carry_out|5| which notifies control state machine 304 that more than thirty one unconveyed packed entropy code word bits have been generated. At the beginning of an entropy code word packing operation, accumulator register 324, signal adder_out [4], and signal carry_out|5| are initialized to zero.

Entropy code output signal X0|n−1:0| sequentially flows through 2:1 multiplexer units 328, 330, 332, and 334 which successively transform respective input signals for efficient entropy code word packing in a selected bit position arrangement. Accumulator register 324 output signal bits Acc[3:0] are respectively distributed as an input signal to multiplexer units 334, 332, 330, and 328 i.e. multiplexer unit 334 receives Acc[3], multiplexer unit 332 receives Acc[2], and so on. Each of multiplexer units 328, 330, 332, and 334 includes a respective entropy code output signal X1 |n:0|, entropy code output signal X2|n+2:0|, entropy code output signal X3|n+6:0|, and entropy code output signal X4|n+14:0|. The input signal and output signal of multiplexer units 328,330,332, and 334 are characterized in Table 1.

TABLE 1

| X0[n − 1:0] = entropy code word in MSBs with any remaining LSBs equal to zero. |
|---|
| if Acc[0] = 1  X1[n] = 0, X1[n − 1:0] = X0[n − 1:0] |
| if Acc[0] = 0  X1[n:1] = X0[n − 1:0], X1[0] = 0 |
| if Acc[1] = 1  X2[n + 2:n + 1] = 0, X2[n:0] = X1 [n:0] |
| if Acc[1] = 0  X2[n + 2:2] = X1[n:0], X2[1:0] = 0 |
| if Acc[2] = 1  X3[n + 6:n + 3] = 0, X3[n + 2:0] = X2[n + 2:0] |
| if Acc[2] = 0  X3[n + 6:4] = X2[n + 2:0], X3[3:0] = 0 |
| if Acc[3] = 1  X4[n + 14:n + 7] = 0, X4[n + 6:0] = X3[n + 6:0] |
| if Acc[3] = 0  X4[n + 14:8] = X3[n + 6:0], X4[7:0] = 0 |

As characterized by Table 1, each respective input signal is altered by the addition of placement bits and passes through multiplexer units 328, 330, 332, and 334. A number of zeros equal to the representative bit position of the respective applied accumulator output signals Acc|3:0| are added to the MSBs of the respective multiplexer input signal if the respective applied accumulator output signal Acc|x| equals one. Otherwise, the zeros are appended to the respective multiplexer input signal. The respective input signal is otherwise passed through each of multiplexer units 328, 330, 332, and 334 unaltered.

Path selection logic 326 in conjunction with arithmetic unit 316 output signal adder_out|4| selects the appropriate latch_0 318 or latch_1 320 in which to latch the sixteen MSBs and sixteen LSBs of path selection logic 326 output signal, packed_entropy_code. Path selection logic 326 generally toggles between latch_0 318 or latch_1 320 to store the MSBs based upon results of the most recent entropy code packing operation. The six bit output signal of arithmetic unit 316 represents bit lengths of previously latched entropy code words plus the bit length of the current entropy code word to be latched up to a size equal to the combined size of latch_0 318 and latch_1 320 which in this embodiment equals thirty-two. An adder_out|4| signal equal to logic one indicates the generation of more than fifteen bits of unconveyed, packed entropy code words. Therefore, signal adder_out|4| equals one indicates that the latch receiving the most significant sixteen bits of output signal packed_entropy_code is full, and path selection logic 326 toggles the paths to latch_0 318 and latch_1 320 for the next entropy code packing operation.

Figure 4:
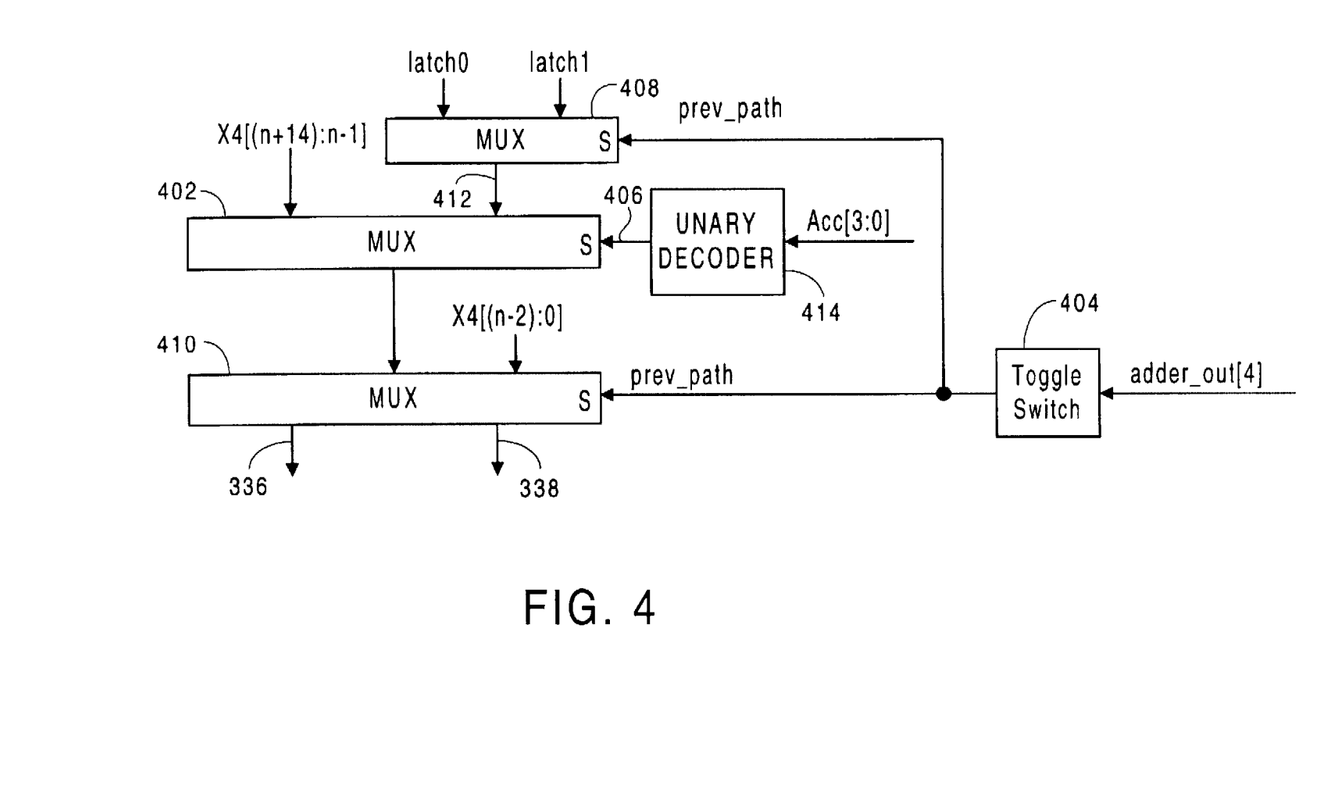
FIG. 4 is a path selection logic unit of the bitstream processor of FIG. 3.

In one embodiment, this entropy code packing operation is implemented by path selection logic 326 of FIG. 4. The most significant sixteen bits of entropy code output signal X4|n+14:n−1| are applied to inputs of bit wise multiplexer 402, and the sixteen bits of either latch_0 318 or latch_1 320 are selected by select signal, prev_path, and applied to other inputs of bit wise multiplexer 402. Toggle switch 404 toggles the logical value of select signal prev_path after every individual entropy code word packing operation if adder_out|4| equals one. In other words, if signal adder_out|4| equals one after an individual entropy code word packing operation, then toggle switch 404 will toggle the logical value of select signal prev_path for the next individual entropy code word packing operation, otherwise select signal prev_path remains unchanged.

In one embodiment, if select signal prev_path equals zero, then multiplexer 408 passes the contents of latch_0 318 via conduction path 412 to an input of bit wise multiplexer 402, and if select signal prev_path equals one, then multiplexer 408 passes the contents of latch_1 320 via conduction path 412 to an input of bit wise multiplexer 402. Also, if select signal prev_path equals zero, multiplexer 410 passes the sixteen bit multiplexer 402 output signal to latch_0 318 via conduction path 336, and the LSBs of entropy code output signal X4|n+14:0|, X4|(n−2):0|, are passed to latch_1 320 via conduction path 338. If select signal prev_path equals one, multiplexer 410 passes the multiplexer 402 output signal to latch_1 320 and X4|(n−2):0| passes to latch_0 318. As a result, when select signal prev_path changes, the selection of conduction paths 336 and 338 by multiplexer 410 also changes.

Unary decoder 414 provides a sixteen bit unary decoded output signal on conduction path 406 based upon signal Acc|3:0| i.e. a number of most significant unary decoded output signal bits equal to one equals the decimal value represented by signal Acc|3:0|. For example, if Acc|3:0| equals 1010b, then the unary decoded output signal equals 1111 1111 1100 0000b (where "b" indicates a binary number). Bit wise multiplexer 402 passes to an input of multiplexer 410 a bit of entropy code output signal X4|n+14:n−1| if the corresponding unary decoded output signal equals zero and otherwise passes a bit of the signal from conduction path 412.

When either or both latch_0 318 and latch_1 320 are full with packed and unconveyed entropy code words, the contents of the full latch(es) are accessed by register file 340. Signals adder_out|4|, carry_out|5|, and select signal prev_path are written to a register in register file 340. Because adder_out|4| equal to one indicates when more than fifteen bits of packed and unaccessed entropy code has been generated by VLC data stream position arrangement module 312, adder_out|4| equal to one indicates that one of latches 318 or 320 is full. The select signal prev_path notifies control state machine 304 as to which of latches 318 or 320 is full and ready to convey packed entropy code words to register file 340. If both latches 318 and 320 are full, the output signal of adder unit 322 is equal to 100000b. Then carry_out|5| equals one which notifies control state machine 304 that both latches 318 and 320 are full. If n equals seventeen, this circumstance arises only if the most significant bits of one of latches 318 and 320 are full, i.e. occupied by bits of an unconveyed entropy code word(s), and the next entropy code word is seventeen bits long. Otherwise, the contents of a full one of latches 318 and 320 will be conveyed to register file 340 prior to filling the other one of latches 318 and 320. Only an empty one of latches 318 and 320, i.e. bit positions having no unconveyed entropy code word(s), should be written to from path selection logic 326. VLC data stream position arrangement module 312 should be disabled before a completely full one or both of latches 318 and 320 are written to in order to preserve unaccessed data.

The following is an example of an entropy code packing operation where n equals seventeen.

First entropy code word=0000 0000 0101 011 bit length= 01111

Acc |3:0|=0000 adder_out|5:0|=01111 carry_out|5|=0
      X0=0000 0000 0101 011
      X1=0000 0000 0101 0110 00
      X2=0000 0000 0101 0110 0000
      X3 32 0000 0000 0101 0110 0000 0000
      X4=0000 0000 0101 0110 0000 0000 0000 0000
      unary decoder=0000 0000 0000 0000
      prev_path=0
      LATCH_0=0000 0000 0101 0110 (fifteen MSBs of LATCH_0 are full, and the LSB is empty).
      LATCH_1 =0000 0000 0000 0000 (all bits of LATCH_1 are empty)

Second entropy code word=0 0000 0000 0011 0111 bit length=10001

Acc |3:0|=1111 adder_out|5:0|=00000 carry_out|5|=1
      X0=000000000001 1011 1
      X3=0000 0000 0000 1101 11
      X2=0000 0000 0001 0011 0111
      X3=0000 0000 0000 0000 0011 0111
      X4=0000 0000 0000 0000 0000 0000 0011 0111
      unarydecoder=1111 1111 1111 1110
      prev_path=0 (select signal prev_path does not toggle during next cycle because adder_out|4| equals 0).
      LATCH_0=0000 0000 0101 0110 (LATCH_0 is full as indicated by carry_out|5|=1, and contents are ready for transmission to register file 340.)
      LATCH_1=0000 0000 0011 0111 (LATCH_1 is full as indicated by carry_out|5|=1, and contents are ready for transmission to register file 340.)

Third entropy code word=0000 1011 bit length=01000
    Acc |3:0|=0000 adder_out|5:0|=01000 carry_out|5|=0
      X0=0000 1011 0000 0000 0
      X1=0000 1011 0000 0000 00
      X2=0000 1011 0000 0000 0000
      X3=0000 1011 0000 0000 0000 0000

X4=0000 1011 0000 0000 0000 0000 0000 0000
unary decoder=0000 0000 0000 0000
prev_path=0
LATCH_0=0000 1011 0000 0000 (the eight MSBs of LATCH_0 are fall.)
LATCH_1=0000 0000 0000 0000 (LATCH_1 is empty).
Fourth entropy code word=010 bit length=00011
Acc |3:0|=1000 adder_out|5:0|=01011 carry_out|5|=0
X0=0100 0000 0000 0000 0
X1=0100 0000 0000 0000 00
X2=0100 0000 0000 0000 0000
X3=0100 0000 0000 0000 0000 0000
X4=0000 0000 0100 0000 0000 0000 0000 0000
unary decoder=1111 1111 0000 0000
prev_path=0
LATCH_0=0000 1011 0100 0000 (the eleven MSBs of LATCH_0 are full)
LATCH_1=0000 0000 0000 0000 (LATCH_1 is empty).
Fifth entropy code word=0000 010 bit length=00111
Acc |3:0|1011 adder_out|5:0|=10010 carry_out|5|=0
X0=0000 0100 0000 0000 0
X1=0000 0010 0000 0000 00
X2=0000 0000 1000 0000 0000
X3=0000 0000 1000 0000 0000 0000
X4=0000 0000 0000 0000 1000 0000 0000 0000
unary decoder=1111 1111 1110 0000
prev_path=0 (select signal prev_path will be toggled at the next cycle)
LATCH_0=0000 1011 0100 0000 (LATCH_0 is full as indicated by adder_out|4| equal to one. The contents of LATCH_0 will be written into register file 340.)
LATCH_1=1000 0000 0000 0000 (the two MSBs of LATCH_1 are full)

While the invention has been described with respect to the embodiments and variations set forth above, these embodiments and variations are illustrative and the invention is not to be considered limited in scope to these embodiments and variations. For example, other values of n may be implemented by, for example, adjusting the sizes of multiplexer units 328, 330, 332, and 334, latches 318 and 320, and arithmetic unit 316. Additionally, various logical implementations of FIGS. 3 and 4 are possible. Furthermore, the functionality of VLC data stream position arrangement module 312 VLC data stream may be implemented using a processor and software. Accordingly, various other embodiments and modifications and improvements not described herein may be within the spirit and scope of the present invention, as defined by the following claims.

What is claimed is:

1. An apparatus to arrange variable length code words in a storage device, each variable length code word having a predetermined bit length, the apparatus comprising:
   a variable length code position arrangement module, the variable length code position arrangement module comprising:
      an arithmetic module having an adder and an accumulator register, wherein the arithmetic module receives predetermined variable length code bit length signals for each variable length code word, the accumulator accumulates variable length code bit length information, and the adder sums accumulated variable length code bit length information and a current variable bit code length; and
      a multi-stage data processing module having an input node to receive an n-bit signal and an input node to receive accumulated variable length code bit length information, wherein the n-bit signal includes a variable length code word, and the multi-stage processing module arranges the n-bit signal within an m-bit signal, an arranged m-bit signal having a number of spacing bits equal to the accumulated variable length code bit length information preceding the n-bit signal;
   a storage device; and
   a path selection module, coupled to the storage device and to an output node of the multi-stage data processing module, the path selection module being capable of combining the arranged m-bit signal with any unconveyed contents of the storage device, wherein the most significant, non-spacing bits of the m-bit signal follow any unconveyed variable length code words in the storage device.

2. The apparatus as in claim 1 wherein the storage device includes a first and second latch, the path selection module further being coupled to the arithmetic unit, and the path selection logic being further capable of determining which of the first and second latches includes unconveyed variable length code word contents and combining the unconveyed variable length code word contents with the m-bit signal.

3. The apparatus as in claim 2 wherein the adder of the arithmetic module is further capable of providing information to the path selection module which indicates when one of the first and second latches is full of unconveyed variable length code word contents to allow the path selection logic to select one of the first and second latches which is not full of unconveyed variable length code word contents and to combine the contents of the selected latch with the m-bit signal.

4. The apparatus as in claim 1 further comprising:
   a multimedia multiprocessor system that includes the variable length code position arrangement module.

5. The apparatus as in claim 1 wherein the variable length code words are characterized by a standard from a group consisting of MPEG-1, MPEG-2, H.261, or H.263.

6. The apparatus as in claim 1 wherein the path selection module is further capable of multiplexing the m-bit signal with contents of the storage device, generating a selection signal corresponding to the accumulated bit length information, and selecting the x most significant bits of unconveyed contents of the storage device and the m minus x most significant bits of the m-bit signal, wherein x equals the number spacing bits.

7. The apparatus as in claim 6 wherein the path selection module is further capable of generating the selection signal by unary decoding the accumulated bit length information and selecting the x most significant bits of unconveyed contents of the storage device using the unary decoded accumulated bit length information.

8. The apparatus as in claim 1 wherein n equals seventeen and m equals thirty two.

9. The apparatus as in claim 1 further comprising:
   a bitstream processor having the variable length code position arrangement module;
   a digital signal processor coupled to the bitstream processor; and
   a memory coupled to the digital signal processor.

10. The apparatus as in claim 9 further comprising:
    a host processor coupled to the digital signal processor.

11. The apparatus as in claim 9 wherein the digital signal processor is a multimedia signal processor.

12. A method of arranging a variable length code word in a storage device of a data processing system, each variable length code word having a predetermined bit length, the method comprising the steps of:

receiving bit_length signals representing the bit length of the variable length code words;

accumulating bit length information of previously stored variable length code words from the received bit_length signals;

receiving an n-bit input signal representing a variable length code word;

arranging the variable length code word within an m-bit signal, the m-bit signal having x spacing bits preceding the variable length code word, wherein x corresponds to the accumulated bit length information;

combining the least significant m−x bits of the m-bit signal with the x most significant contents of the storage device, wherein the combining step comprises the steps of:

multiplexing the m-bit signal with contents of the storage device;

generating a selection signal corresponding to the accumulated bit length information; and selecting the x most significant bits of unconveyed contents of the storage device and the m minus x most significant bits of the m-bit signal.

13. The method as in claim 12 further comprising the step of:

storing in the storage device the combined least significant m−x bits of the m-bit signal and the x most significant contents of the storage device.

14. The method as in claim 12 wherein the storage device is an n minus one bit storage device, the method further comprising the step of:

storing m minus n minus one overflow bits in a second storage device.

15. The method as in claim 12 wherein the step of generating a selection signal comprises the step of:

unary decoding the accumulated bit length information.

16. The method as in claim 12 wherein each variable length code word has a maximum of n bits.

17. The method as in claim 12 further comprising the step of:

providing the contents of the storage device to a processor.

18. The method as in claim 12 wherein n equals seventeen and m equals thirty two.

19. A method of arranging a variable length code word in a storage device of a data processing system, each variable length code word having a predetermined bit length, the method comprising the steps of:

receiving bit_length signals representing the bit length of the variable length code words;

accumulating bit length information of previously stored variable length code words from the received bit_length signals;

receiving an n-bit input signal representing a variable length code word;

arranging the variable length code word within an m-bit signal, the m-bit signal having x spacing bits preceding the variable length code word, wherein x corresponds to the accumulated bit length information;

combining the least significant m−x bits of the m-bit signal with the x most significant contents of the storage device;

binary encoding the accumulated bit length information into a four bit accumulated data signal, Acc|3:0|;

wherein the step of arranging comprises the steps of:

applying the n-bit input signal to a first signal processing stage;

arranging the n-bit input signal within an n+1 bit signal, wherein the n-bit signal occupies the most significant bits of the n+1 bit signal if Acc|0| is zero;

applying the n+1 bit input signal to a second signal processing stage;

arranging the n+1 bit input signal within an n+3 bit signal, wherein the n+1 bit signal occupies the most significant bits of the n+3 bit signal if Acc|1| is zero;

applying the n+3 bit input signal to a second signal processing stage;

arranging the n+3 bit input signal within an n+7 bit signal, wherein the n+3 bit signal occupies the most significant bits of the n+7 bit signal if Acc|2| is zero;

applying the n+7 bit input signal to a second signal processing stage; and arranging the n+7 bit input signal within an n+15 bit signal, wherein the n+7 bit signal occupies the most significant bits of the n+15 bit signal if Acc|3| is zero.

20. The method as in claim 19 wherein the combining step comprises the steps of:

multiplexing the m-bit signal with contents of the storage device;

generating a selection signal corresponding to the accumulated bit length information; and selecting the x most significant bits of unconveyed contents of the storage device and the m minus x most significant bits of the m-bit signal.

21. The method as in claim 19 wherein n equals seventeen and m equals thirty two.

22. The method as in claim 19 further comprising the step of:

storing in the storage device the combined least significant m−x bits of the m-bit signal and the x most significant contents of the storage device.

23. The method as in claim 19 wherein the storage device is an n minus one bit storage device, the method further comprising the step of:

storing m minus n minus one overflow bits in a second storage device.

24. The method as in claim 19 wherein the step of generating a selection signal comprises the step of:

unary decoding the accumulated bit length information.

25. The method as in claim 19 wherein each variable length code word has a maximum of n bits.

26. The method as in claim 19 further comprising the step of:

providing the contents of the storage device to a processor in a multimedia multiprocessor system.

27. A multimedia system having a capability to arrange variable length code words in a storage device, each variable code word having a predetermined bit length, the apparatus comprising:

a variable length code position arrangement module, the variable length code position arrangement module comprising:

an arithmetic module having an adder and an accumulator register, wherein the arithmetic module receives predetermined variable length code bit length signals for each variable length code word, and the accumulator accumulates variable length code bit length information, and the adder sums accumulated variable length code bit length information and a current variable bit code length; and a multi-stage data processing module having an input node to receive an n-bit signal and an input node to receive accumulated variable length code bit length information, wherein the n-bit signal includes a variable length code word, and the multi-stage processing module arranges the n-bit signal within an m-bit signal, an arranged m-bit signal having x spacing bits equal to the accumulated variable length code bit length information preceding the n-bit signal, the multi-stage data processing module further being capable of binary encoding the accumulated bit length information into a four bit accumulated data signal, Acc[3:0], applying the n-bit input signal to a first signal processing stage, arranging the n-bit input signal within an n+1 bit signal, wherein the n-bit signal occupies the most significant bits of the n+1 bit signal if Acc[0] is zero, applying the n+1 bit input signal to a second signal processing stage, arranging the n+1 bit input signal within an n+3 bit signal, wherein the n+1 bit signal occupies the most significant bits of the n+3 bit signal if Acc[1] is zero, applying the n+3 bit input signal to a second signal processing stage, arranging the n+3 bit input signal within an n+7 bit signal, wherein the n+3 bit signal occupies the most significant bits of the n+7 bit signal if Acc[2] is zero; applying the n+7 bit input signal to a second signal processing stage, and arranging the n+7 bit input signal within an n+15 bit signal, wherein the n+7 bit signal occupies the most significant bits of the n+15 bit signal if Acc[3] is zero.

28. The multimedia system as in claim 27 further comprising:

a multimedia multiprocessor system that includes the variable length code position arrangement module.

29. The multimedia system as in claim 27 wherein n equals seventeen and m equals thirty two.

30. A multimedia system having a capability of arranging a variable length code word in a storage device, each variable length code word having a predetermined bit length, the multimedia system comprising:

means for receiving bit_length signals representing the bit length of the variable length code words;

means for accumulating bit length information of previously stored variable length code words from the received bit_length signals;

means for receiving an n-bit input signal representing a variable length code word;

means for arranging the variable length code word within an m-bit signal, the m-bit signal having x spacing bits preceding the variable length code word, wherein x corresponds to the accumulated bit length information;

means for combining the least significant m−x bits of the m-bit signal with the x most significant contents of the storage device;

means for multiplexing the m-bit signal with contents of the storage device;

means for generating a selection signal corresponding to the accumulated bit length information; and means for selecting the x most significant bits of unconveyed contents of the storage device and the m minus x most significant bits of the m-bit signal.

31. The multimedia system of claim 28 further comprising:

means for binary encoding the accumulated bit length information into a four bit accumulated data signal, Acc[3:0];

means for applying the n-bit input signal to a first signal processing stage;

means for arranging the n-bit input signal within an n+1 bit signal, wherein the n-bit signal occupies the most significant bits of the n+1 bit signal if Acc[0] is zero;

means for applying the n+1 bit input signal to a second signal processing stage;

means for arranging the n+1 bit input signal within an n+3 bit signal, wherein the n+1 bit signal occupies the most significant bits of the n+3 bit signal if Acc[1] is zero;

means for applying the n+3 bit input signal to a second signal processing stage;

means for arranging the n+3 bit input signal within an n+7 bit signal, wherein the n+3 bit signal occupies the most significant bits of the n+7 bit signal if Acc[2] is zero;

means for applying the n+7 bit input signal to a second signal processing stage; and means for arranging the n+7 bit input signal within an n+15 bit signal, wherein the n+7 bit signal occupies the most significant bits of the n+15 bit signal if Acc[3] is zero.

32. The multimedia system of claim 30 further comprising:

a digital signal processor; and means for conveying contents of the storage device to the digital signal processor.

* * * * *